United States Patent [19]
Laskaris

[11] Patent Number: 5,448,214
[45] Date of Patent: Sep. 5, 1995

[54] OPEN MRI MAGNET WITH SUPERCONDUCTIVE SHIELDING

[75] Inventor: Evangelos T. Laskaris, Schenectady, N.Y.

[73] Assignee: General Electric Company, Schenectady, N.Y.

[21] Appl. No.: 260,433

[22] Filed: Jun. 15, 1994

[51] Int. Cl.$^6$ .............................................. H01F 7/22
[52] U.S. Cl. .................... 335/301; 335/216; 335/299; 324/318; 324/319
[58] Field of Search ............ 335/216, 299, 301; 324/318, 319, 320; 128/653.1, 653.2, 653.5

[56] References Cited

U.S. PATENT DOCUMENTS

| | | |
|---|---|---|
| 4,500,860 | 2/1985 | Vermilyea . |
| 4,506,247 | 3/1985 | Vermilyea . |
| 4,509,030 | 4/1985 | Vermilyea . |
| 4,523,166 | 6/1985 | Gross . |
| 4,560,933 | 12/1985 | Forster et al. ............ 324/319 |
| 4,571,568 | 2/1986 | Grangereau ............. 335/299 |
| 4,581,580 | 4/1986 | Keim . |
| 4,591,790 | 5/1986 | Takahashi ................ 324/318 |
| 4,595,899 | 6/1986 | Smith et al. .............. 335/216 |
| 4,654,596 | 3/1987 | Savelainen ............... 324/320 |
| 4,724,412 | 2/1988 | Kalafala . |
| 4,758,812 | 7/1988 | Forster et al. ............ 335/301 |
| 4,924,198 | 5/1990 | Laskaris . |
| 5,006,804 | 4/1991 | Dorri et al. . |
| 5,237,300 | 8/1993 | Ige et al. ................. 335/299 |
| 5,291,169 | 3/1994 | Ige et al. ................. 335/216 |

OTHER PUBLICATIONS

"Open MRI Magnet Having a Support Structure", by E. T. Laskaris & C. Minas, U.S. Patent Application Serial No. 08/181,514, filed Jan. 14, 1994.

"Open MRI Magnet with Uniform Magnetic Field", by E. T. Laskaris & B. Dorri, U.S. Patent Application Serial No. 08;/223,200, filed Apr. 5, 1994.

*Primary Examiner*—Leo P. Picard
*Assistant Examiner*—Raymond M. Barrera
*Attorney, Agent, or Firm*—Douglas E. Erickson; Paul R. Webb, II

[57] ABSTRACT

An open magnetic resonance imaging (MRI) magnet having two generally toroidal-shaped superconductive coil assemblies spaced apart by generally spaced-apart and generally parallel inter-coil-assembly posts. Each coil assembly has associated with it a generally annular-shaped superconductive shielding assembly and at least two spaced-apart assembly posts each having one end attached to the coil assembly and another end attached to the shielding assembly The shielding coil within the shielding assembly has an inner diameter greater than the outer diameter of the main coil within the coil assembly. A cryocooler coldhead cools the entire magnet. Magnetic shielding is achieved while maintaining the openness of the open magnet.

10 Claims, 2 Drawing Sheets ics. Known superconductive magnets include liquid-helium cooled and cryocooler-cooled superconductive magnets. Typically, for a cryocooler-cooled magnet, the superconductive coil assembly includes a superconductive main coil surrounded by a thermal shield surrounded by a vacuum enclosure. A cryocooler coldhead is externally mounted to the vacuum enclosure, has its first stage in thermal contact with the thermal shield, and has its second stage in thermal contact with the superconductive main coil.

OPEN MRI MAGNET WITH SUPERCONDUCTIVE SHIELDING

BACKGROUND OF THE INVENTION

The present invention relates generally to an open superconductive magnet used to generate a uniform magnetic field as part of a magnetic resonance imaging (MRI) diagnostic system, and more particularly to such a magnet having superconductive shielding to protect the area around the magnet from stray magnetic fields originating from the magnet.

MRI systems employing superconductive or other type magnets are used in various fields such as medical diagnostics. Known superconductive magnets include liquid-helium cooled and cryocooler-cooled superconductive magnets. Typically, for a cryocooler-cooled magnet, the superconductive coil assembly includes a superconductive main coil surrounded by a thermal shield surrounded by a vacuum enclosure. A cryocooler coldhead is externally mounted to the vacuum enclosure, has its first stage in thermal contact with the thermal shield, and has its second stage in thermal contact with the superconductive main coil.

Known superconductive magnet designs include closed magnets and open magnets. Closed magnets typically have a single, tubular-shaped superconductive coil assembly having a bore. The superconductive coil assembly includes several radially-aligned and longitudinally spaced-apart superconductive main coils each carrying a large, identical electric current in the same direction. The superconductive main coils are thus designed to create a magnetic field of high uniformity within a spherical imaging volume centered within the magnet's bore where the object to be imaged is placed. A single, tubular-shaped superconductive shielding assembly may also be used to prevent the high magnetic field created by and surrounding the main coils from adversely interacting with electronic equipment in the vicinity of the magnet. Such shielding assembly includes several radially-aligned and longitudinally spaced-apart superconductive shielding coils each carrying electric current of generally equal amperage, but in an opposite direction, to the electric current carried in the main coils and are positioned radially outward of the main coils.

Open magnets typically employ two spaced-apart superconductive coil assemblies with the space between the assemblies allowing for access by medical personnel for surgery or other medical procedures during MRI imaging. The patient may be positioned in that space or also in the bore of the toroidal-shaped coil assemblies. The open space helps the patient overcome any feelings of claustrophobia that may be experienced in a closed magnet design. Open magnets may be shielded passively, but that would take away the openness of the magnet. Shielding the room (instead of the magnet) is too expensive to consider in many installations.

SUMMARY OF THE INVENTION

It is an object of the invention to provide an open superconductive MRI magnet having superconductive shielding.

The open magnetic resonance imaging magnet of the invention includes a generally toroidal-shaped superconductive first coil assembly including a generally annular-shaped superconductive first main coil, a generally toroidal-shaped superconductive second coil assembly spaced apart from the first coil assembly and including a generally annular-shaped superconductive second main coil, and at least two spaced-apart, generally parallel, inter-coil-assembly posts each having a first end attached to the first coil assembly and a second end attached to the second coil assembly. The magnet also includes a generally annular-shaped superconductive first shielding assembly including a generally annular-shaped superconductive first shielding coil having an inner diameter greater than the outer diameter of the first main coil and spaced apart from the first coil assembly generally opposite the inter-coil-assembly posts, and the magnet also includes at least two spaced-apart first-assembly posts each having one end attached to the first coil assembly and another end attached to the first shielding assembly. The magnet further includes a generally annular-shaped superconductive second shielding assembly including a generally annular-shaped superconductive second shielding coil having an inner diameter greater than the outer diameter of the second main coil and spaced apart from the second coil assembly generally opposite the inter-coil-assembly posts, and the magnet further includes at least two spaced-apart second-assembly posts each having one end attached to the second coil assembly and another end attached to the second shielding assembly. All of the first and second coil assemblies and main coils and the first and second shielding assemblies and shielding coils are generally coaxially aligned.

Several benefits and advantages are derived from the invention. The annular-shaped shielding coil assembly (with superconductive shielding coil) and spaced-apart assembly post design added to each of the superconductive coil assemblies gives an open MRI magnet which is shielded while maintaining the openness of the magnet. Such openness allows for access by medical personnel for surgery or other medical procedures during MRI imaging as well as helping the patient overcome any feelings of claustrophobia that may be otherwise experienced.

BRIEF DESCRIPTION OF THE DRAWINGS

The accompanying drawings illustrate a preferred embodiment of the present invention wherein.

DETAILED DESCRIPTION OF THE INVENTION

Figure 1:
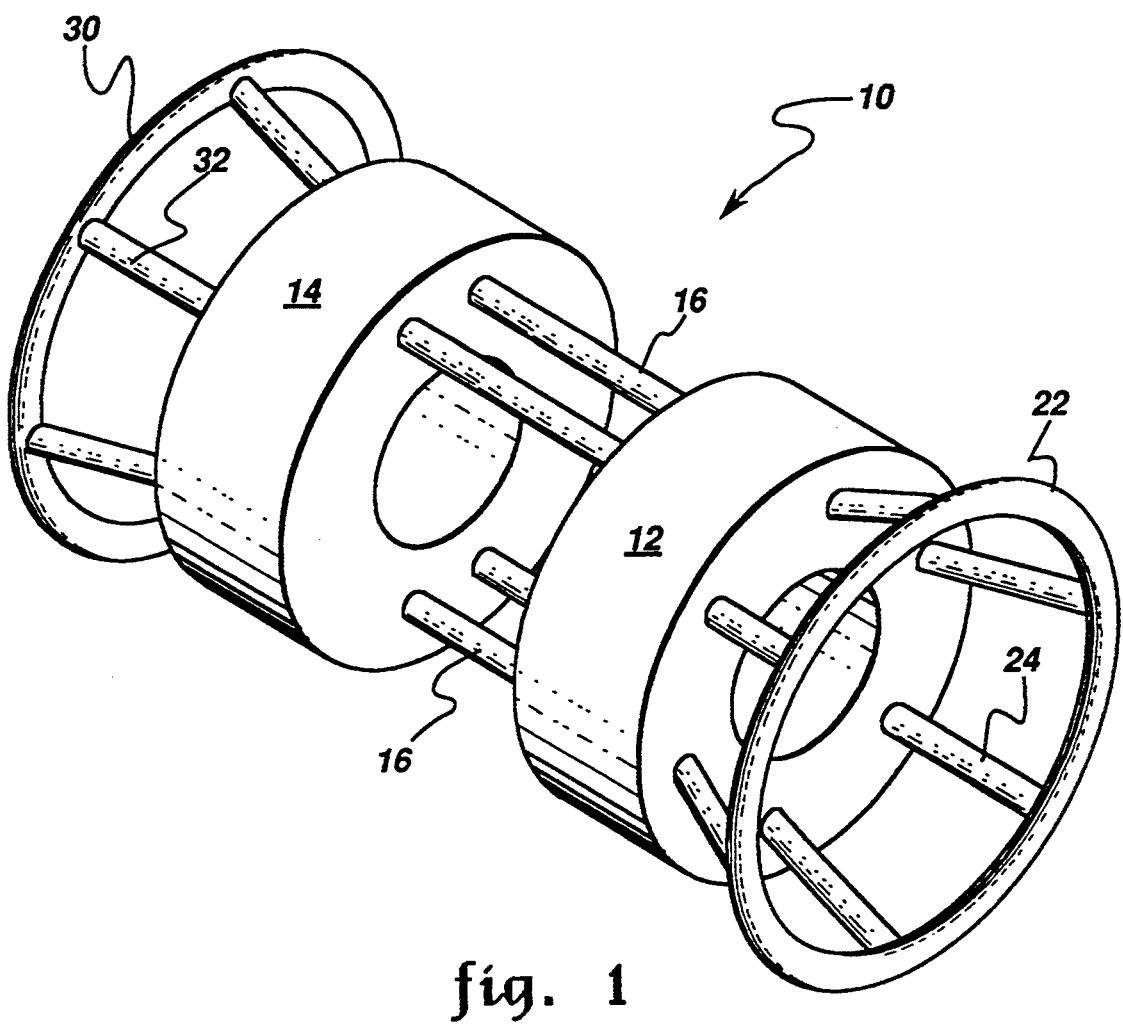
FIG. 1 is a perspective view of the open superconductive MRI magnet of the invention including the magnet's superconductive shielding but with the magnet's accompanying cryocooler coldhead and floor mount omitted for clarity.
Figure 2:
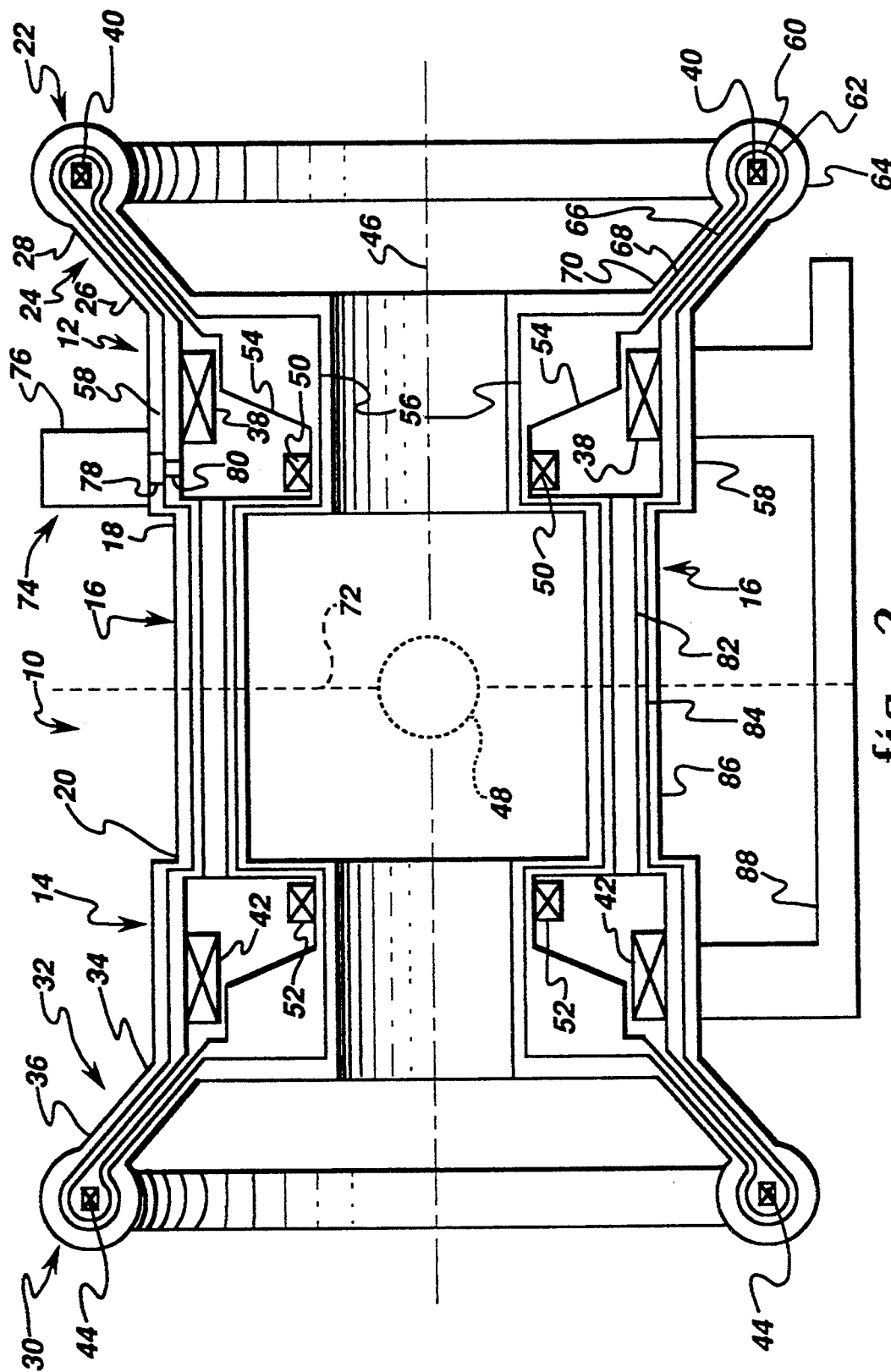
FIG. 2 is a schematic cross-sectional side-elevational view of the MRI magnet of FIG. 1 with a cryocooler coldhead and magnet floor mount added.

Referring now to the drawings, wherein like numerals represent like elements throughout, FIGS. 1-2 show the open magnetic resonance imaging (MRI) magnet 10 of the present invention. The magnet 10 includes a generally toroidal-shaped superconductive first coil assembly 12, a generally toroidal-shaped superconductive second coil assembly 14 spaced apart from the first coil assembly 12, and a plurality (preferably four) of spaced-apart, generally parallel, inter-coil-assembly posts 16 each having a first end 18 attached to the first coil assembly 12 and a second end 20 attached to the second coil assembly 14. The magnet 10 also includes a generally annular-shaped superconductive first shielding assembly 22 spaced-apart from the first coil assembly 12 generally opposite the inter-coil-assembly posts 16 and also includes a plurality (preferably six) of spaced-apart first-assembly posts 24 each having one end 26 attached to the first coil assembly 12 and another end 28 attached to the first shielding assembly 22. The magnet 10 further includes a generally annular-shaped superconductive second shielding assembly 30 spaced-apart from the second coil assembly 14 generally opposite the inter-coil-assembly posts 16 and further includes a plurality (preferably six) of spaced-apart second-assembly posts 32 each having one end 34 attached to the second coil assembly 14 and another end 36 attached to the second shielding assembly 30.

The first coil assembly 12 includes a generally annular-shaped superconductive first main coil 38, and the first shielding assembly 22 includes a generally annular-shaped superconductive first shielding coil 40 having an inner diameter greater than the outer diameter of the first main coil 38. Likewise, the second coil assembly 14 includes a generally annular-shaped superconductive second main coil 42, and the second shielding assembly 30 includes a generally annular-shaped superconductive second shielding coil 44 having an inner diameter greater than the outer diameter of the second main coil 42. All of the first and second coil assemblies 12 and 14 and main coils 38 and 42 and the first and second shielding assemblies 22 and 30 and shielding coils 40 and 44 are generally coaxially aligned having a common longitudinal axis 46. It is noted that the first and second-assembly posts 24 and 32 support the axial repulsive electromagnetic force on the first and second shielding coils 40 and 44. To reduce the magnetic field inhomogeneity within the imaging volume 48 (shown in dotted line in FIG. 2) of the open MRI magnet 10 to levels acceptable for medical imaging, the first coil assembly 12 additionally includes a first bucking coil 50, and the second coil assembly 14 additionally includes a second bucking coil 52.

The first main coil 38 carries an electric current in a first direction. The first direction is defined to be either a clockwise or a counterclockwise circumferential direction about the longitudinal axis 46 with any slight longitudinal component of current direction being ignored. The first shielding coil 40 (as well as the first bucking coil 50) carries an electric current in a direction opposite to the first direction (i.e., in a direction opposite to the direction of the electric current carried by the first main coil 38). The second main coil 42 carries an electric current in the same direction as that of the first main coil 38, the second shielding coil 44 carries an electric current in the same direction as that of the first shielding coil 40, and the second bucking coil 52 carries an electric current in the same direction as that of the first bucking coil 50. Preferably, all of the currents are generally equal in amperage.

The first coil assembly 12 has a first main coil form 54 supporting the first main coil 38 (and supporting the first bucking coil 50), a thermal shield 56 generally spaced apart from and generally surrounding the first main coil 38 and the first main coil form 54, and a housing 58 generally spaced apart from and generally surrounding the thermal shield 56 of the first coil assembly 12. The first shielding assembly 22 has a first shielding coil form 60 supporting the first shielding coil 40, a thermal shield 62 generally spaced apart from and generally surrounding the first shielding coil 40 and the first shielding coil form 60, and a housing 64 generally spaced apart from and generally surrounding the thermal shield 62 of the first shielding assembly 22. At least one (and preferably all) of the first-assembly posts 24 includes a first central member 66 in thermal contact with the first shielding coil form 60 and the first main coil form 54, a thermal shield 68 generally spaced apart from and generally surrounding the first central member 66 and in thermal contact with the thermal shield 62 of the first shielding assembly 22 and the thermal shield 56 of the first coil assembly 12, and a housing 70 generally spaced apart from and generally surrounding the thermal shield 68 of the at least one first-assembly post 24 and in thermal contact with the housing 64 of the first shielding assembly 22 and the housing 58 of the first coil assembly 12.

The second coil assembly 14 is a generally mirror image of the first coil assembly 12 about a plane 72 (seen on edge as a dashed line in FIG. 2) oriented generally perpendicular to the inter-coil-assembly posts 16 (and perpendicular to the longitudinal axis 46) and disposed generally equidistant from the first and second coil assemblies 12 and 14. Likewise, the second shielding assembly 30 is generally a mirror image of the first shielding assembly 22 about the plane 72, and the plurality of spaced-apart second-assembly posts 32 is generally a mirror image of the plurality of spaced-apart first-assembly posts 24 about the plane 72.

A cryocooler coldhead 74 (such as that of a conventional Gifford McMahon cryocooler), which is also part of the magnet 10, includes a housing 76 attached to the housing 58 of the first coil assembly 12. The cryocooler coldhead 74 has a first stage 78 and a second stage 80. The first stage 78 is in thermal contact with the thermal shield 56 of the first coil assembly 12 and is maintained at a temperature of generally 40 Kelvin. The second stage 80 is in thermal contact with the first main coil form 54 of the first coil assembly 12 and is maintained at a temperature of generally 10 Kelvin.

At least one (and preferably all) of the inter-coil-assembly posts 16 has an inner member 82 in thermal contact with the first main coil form 54. The at least one inter-coil assembly post 16 also has a thermal shield 84 generally spaced apart from and generally surrounding the inner member 82 and in thermal contact with the thermal shield 56 of the first coil assembly 12. The at least one inter-coil assembly post 16 further has a housing 86 generally spaced apart from and generally surrounding the thermal shield 84 of the at least one inter-coil-assembly post 16 and in thermal contact with the housing 58 of the first coil assembly 12. A floor mount 88 supports the magnet 10.

A vacuum enclosure is formed by the combination of the housing 64 of the first shielding assembly 22, the housing 70 of the first-assembly posts 24, the housing 58 of the first coil assembly 12, the housing 86 of the inter-coil-assembly posts 16, and the corresponding housings (shown but not labeled in FIG. 2) of the mirror-image second coil assembly 14, the mirror-image second-assembly posts 32, and the mirror-image second shielding assembly 30. A thermal shield array is formed by the combination of the thermal shield 62 of the first shielding assembly 22, the thermal shield 68 of the first-assembly posts 24, the thermal shield 56 of the first coil assembly 12, the thermal shield 84 of the inter-coil-assembly posts 16, and the corresponding thermal shields (shown but not labeled in FIG. 2) of the mirror-image second coil assembly 14, the mirror-image second-assembly posts 32, and the mirror-image second shielding assembly 30. A thermal conductor structure is formed by the combination of the first shielding coil form 60 of the first shielding assembly 22, the first central members 66 of the first-assembly posts 24, the first main coil form 54 of the first coil assembly 12, the inner members 82 of the inter-coil-assembly posts 16, and the corresponding members (shown but not labeled in FIG. 2) of the mirror-image second coil assembly 14, the mirror-image second-assembly posts 32, and the mirror-image second shielding assembly 30.

Preferably, the superconductive coils 38, 40, 50, 42, 44, and 52 comprise NbSn superconductive tape (with an added parallel copper stabilizer) together having an unbroken length (or, less desirably, a plurality of lengths connected together by superconductive joints), such tape being wound to create all of the superconductive coils 38, 40, 50, 42, 44, and 52 together as a single electrical path. The first main coil form 54 typically comprises fiberglass (with an aluminum ring, not shown in the figures, to provide thermal conduction and provide support to the radially outward electromagnetic force on the large main coils 38 and 42), and the first shielding coil form 60 typically comprises nonmagnetic stainless steel. The first central members 66 of the first-assembly posts 24 and the inner members 82 of the inter-coil-assembly posts 16 typically comprise copper. The thermal shields 62, 68, 56, and 84 typically comprise aluminum, and the housings 64, 70, 58, and 86 typically comprise nonmagnetic stainless steel. The various spaced-apart elements (e.g., the thermal shield 56 spaced apart from the first main coil form 54) are spaced apart by thermal insulating tubes and the like (not shown in the figures and typically comprising fiberglass). Thermally conductive rings, plates, strips and the like (not shown in the figures and typically comprising copper or aluminum) may be added, as necessary, to provide thermal paths for heat to be removed from all of the superconductive coils 38, 40, 50, 42, 44, and 52 (and from the previously-defined thermal conductor structure) by the second stage 80 of the single cryocooler coldhead 74. It is noted that a separate cryocooler coldhead is not needed to cool the superconductive coils 42, 44, and 52 of the second coil assembly 14 and the second shielding assembly 30.

A computer simulation of the magnet 10 of the invention was performed for a 2,500 pound magnet designed to generate a 0.3 Tesla magnetic field within a spherical imaging volume having a diameter of 25 centimeters and having a peak-to-peak magnetic field inhomogeneity of 7.4 ppm (parts-per-million). Applicant designed the shielding for this particular magnet 10 using the principles of the present invention, previously disclosed herein, together with conventional magnetic field analysis, as is within the skill of the artisan. The first main coil 38 had generally 414600 amp-turns, the first shielding coil 40 had generally −118680 amp-turns, and the first bucking coil 50 had generally −104400 amp-turns. The first main coil 38 had a mean radius of generally 36.0 centimeters and was longitudinally disposed a mean distance of generally 120.6 centimeters from the second main coil 42. The first shielding coil 40 was disposed a mean distance of generally 35.3 centimeters radially outward and generally 39.0 centimeters longitudinally outward of the first main coil 38 The first bucking coil 50 was disposed a mean distance of generally 15.1 centimeters radially inward and generally 6.8 centimeters longitudinally inward of the first main coil 38. It is noted that "mean radius" is one-half the sum of the inner and outer radii. It is further noted that the "mean distance" between two coils is the closest distance between a circle in each coil, such circle having a center located on the longitudinal axis of the coil equidistant the longitudinal boundaries of the coil and having a radius equal to the mean radius of the coil. Computer simulations showed that with the shielding of the invention, the 5 Gauss stray field was located a longitudinal distance of 2.5 meters and a radial distance of 3.5 meters from the center of the imaging volume 48 of the magnet 10. Without such shielding of the invention, the 5 Gauss stray field was located a longitudinal distance of 7.6 meters and a radial distance of 6.2 meters from the center of the imaging volume 48 of the magnet 10. It is seen that the active superconductive magnetic shielding provided by the invention does not use liquid cryogens, makes the open magnet 10 easy to site in medical examination rooms, and retains the openness of the open magnet design.

The foregoing description of a preferred embodiment of the invention has been presented for purposes of illustration. It is not intended to be exhaustive or to limit the invention to the precise form disclosed, and obviously many modifications and variations are possible in light of the above teaching. It is intended that the scope of the invention be defined by the claims appended hereto.

I claim:

1. An open magnetic resonance imaging magnet comprising:
    a) a generally toroidal-shaped superconductive first coil assembly including a generally annular-shaped superconductive first main coil;
    b) a generally toroidal-shaped superconductive second coil assembly spaced apart from said first coil assembly and including a generally annular-shaped superconductive second main coil;
    c) a plurality of spaced-apart, generally parallel, inter-coil-assembly posts each having a first end attached to said first coil assembly and each having a second end attached to said second coil assembly;
    d) a generally annular-shaped superconductive first shielding assembly including a generally annular-shaped superconductive first shielding coil having an inner diameter greater than the outer diameter of said first main coil and spaced apart from said first coil assembly generally opposite said inter-coil-assembly posts;
    e) a plurality of spaced-apart first-assembly posts each having one end attached to said first coil assembly and another end attached to said first shielding assembly;
    f) a generally annular-shaped superconductive second shielding assembly including a generally annular-shaped superconductive second shielding coil having an inner diameter greater than the outer diameter of said second main coil and spaced apart from said second coil assembly generally opposite said inter-coil-assembly posts; and
    g) a plurality of spaced-apart second-assembly posts each having one end attached to said second coil assembly and another end attached to said second shielding assembly, wherein all of said first and second coil assemblies and main coils and said first and second shielding assemblies and shielding coils are generally coaxially aligned.
2. The magnet of claim 1, wherein:

a) said first shielding assembly also includes a first shielding coil form supporting said first shielding coil;

b) said first coil assembly also includes a first main coil form supporting said first main coil; and c) at least one of said first-assembly posts includes a first central member in thermal contact with said first shielding coil form and said first main coil form.

3. The magnet of claim 2, wherein:

a) said first shielding assembly also includes a thermal shield generally spaced apart from and generally surrounding said first shielding coil and said first shielding coil form;

b) said first coil assembly also includes a thermal shield generally spaced apart from and generally surrounding said first main coil and said first main coil form; and c) said at least one first-assembly post includes a thermal shield generally spaced apart from and generally surrounding said first central member and in thermal contact with said thermal shield of said first shielding assembly and said thermal shield of said first coil assembly.

4. The magnet of claim 3, wherein:

a) said first shielding assembly also includes a housing generally spaced apart from and generally surrounding said thermal shield of said first shielding assembly;

b) said first coil assembly also includes housing generally spaced apart from and generally surrounding said thermal shield of said first coil assembly; and c) said at least one first-assembly post includes a housing generally spaced apart from and generally surrounding said thermal shield of said at least one first-assembly post and in thermal contact with said housing of said first shielding assembly and said housing of said first coil assembly.

5. The magnet of claim 4, also including a cryocooler coldhead having a housing attached to said housing of said first coil assembly, having a first stage in thermal contact with said thermal shield of said first coil assembly, and having a second stage in thermal contact with said first main coil form of said first coil assembly.

6. The magnet of claim 5, wherein at least one of said inter-coil-assembly posts has an inner member in thermal contact with said first main coil form.

7. The magnet of claim 6, wherein said at least one inter-coil-assembly post has a thermal shield generally spaced apart from and generally surrounding said inner member and in thermal contact with said thermal shield of said first coil assembly.

8. The magnet of claim 7, wherein said at least one inter-coil-assembly post has a housing generally spaced apart from and generally surrounding said thermal shield of said at least one inter-coil-assembly post and in thermal contact with said housing of said first coil assembly.

9. The magnet of claim 8, wherein said second coil assembly is a generally mirror image of said first coil assembly about a plane oriented generally perpendicular to said inter-coil-assembly posts and disposed generally equidistant from said first and second coil assemblies, wherein said second shielding assembly is a generally mirror image of said first shielding assembly about said plane, and wherein said plurality of spaced-apart second-assembly posts is a generally mirror image of said plurality of spaced-apart first-assembly posts about said plane.

10. The magnet of claim 9; wherein said first coil assembly also includes a first bucking coil; wherein said first main coil has generally 414600 amp-turns, said first shielding coil has generally −118680 amp-turns, and said first bucking coil has generally −104400 amp-turns; wherein said first main coil has a mean radius of generally 36.0 centimeters and is longitudinally disposed a mean distance of generally 120.6 centimeters from said second main coil; wherein said first shielding coil is disposed a mean distance of generally 35.3 centimeters radially outward and generally 39.0 centimeters longitudinally outward of said first main coil; and wherein said first bucking coil is disposed a mean distance of generally 15.1 centimeters radially inward and generally 6.8 centimeters longitudinally inward of said first main coil.

* * * * *